US010181533B2

(12) United States Patent
Marino et al.

(10) Patent No.: US 10,181,533 B2
(45) Date of Patent: Jan. 15, 2019

(54) TRANSCAP MANUFACTURING TECHNIQUES WITHOUT A SILICIDE-BLOCKING MASK

(71) Applicant: QUALCOMM Incorporated, San Diego, CA (US)

(72) Inventors: Fabio Alessio Marino, San Marcos, CA (US); Paolo Menegoli, San Jose, CA (US); Narasimhulu Kanike, San Diego, CA (US); Francesco Carobolante, San Diego, CA (US); Qingqing Liang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/850,118

(22) Filed: Dec. 21, 2017

(65) Prior Publication Data
US 2018/0233605 A1  Aug. 16, 2018

Related U.S. Application Data

(62) Division of application No. 15/429,252, filed on Feb. 10, 2017, now Pat. No. 9,882,066.

(51) Int. Cl.
*H01L 29/93* (2006.01)
*H01L 29/49* (2006.01)
(Continued)

(52) U.S. Cl.
CPC ........ *H01L 29/93* (2013.01); *H01L 21/28052* (2013.01); *H01L 21/28518* (2013.01);
(Continued)

(58) Field of Classification Search
CPC .............. H01L 29/93; H01L 29/66174; H01L 21/28052; H01L 29/4933; H01L 29/456; H01L 21/28518
See application file for complete search history.

(56) References Cited

U.S. PATENT DOCUMENTS 6,018,175 A    1/2000  Kao et al.
6,621,128 B2 * 9/2003  Lee ..................... H01L 27/0805
                                                       257/369
(Continued)

OTHER PUBLICATIONS

International Search Report and Written Opinion—PCT/US2018/014989—ISA/EPO—dated Apr. 30, 2018.

*Primary Examiner* — Victor A Mandala
(74) *Attorney, Agent, or Firm* — Patterson & Sheridan, L.L.P

(57) ABSTRACT

Certain aspects of the present disclosure provide a semiconductor variable capacitor. The semiconductor variable capacitor generally includes a first non-insulative region disposed above a semiconductor region, and a second non-insulative region disposed adjacent to the semiconductor region. In certain aspects, the semiconductor variable capacitor also includes a first silicide layer disposed above the second non-insulative region, wherein the first silicide layer overlaps at least a portion of the semiconductor region. In certain aspects, a control region may be disposed adjacent to the semiconductor region such that a capacitance between the first non-insulative region and the second non-insulative region is configured to be adjusted by varying a control voltage applied to the control region.

8 Claims, 11 Drawing Sheets

(51) Int. Cl.
  *H01L 21/285* (2006.01)
  *H01L 21/28* (2006.01)
  *H01L 29/66* (2006.01)
  *H01L 29/45* (2006.01)
(52) U.S. Cl.
  CPC ........ *H01L 29/456* (2013.01); *H01L 29/4933* (2013.01); *H01L 29/66174* (2013.01); *H01L 29/66189* (2013.01)

(56) References Cited

U.S. PATENT DOCUMENTS

| | | | |
|---|---|---|---|
| 7,259,418 B2* | 8/2007 | Kadowaki | H01L 27/0629 257/312 |
| 7,714,412 B2 | 5/2010 | Coolbaugh et al. | |
| 8,013,379 B2 | 9/2011 | Futatsugi | |
| 8,498,094 B2 | 7/2013 | Marino et al. | |
| 8,803,288 B1 | 8/2014 | Marino et al. | |
| 8,872,281 B2 | 10/2014 | Coolbaugh et al. | |
| 8,963,289 B2* | 2/2015 | Marino | H01L 29/93 257/602 |
| 9,502,586 B1* | 11/2016 | Kim | H01L 29/66181 |
| 9,882,066 B1 | 1/2018 | Marino et al. | |
| 2004/0184216 A1* | 9/2004 | Kurosawa | H01L 27/0808 361/277 |
| 2009/0250739 A1* | 10/2009 | Johnson | H01L 29/93 257/312 |
| 2010/0252880 A1* | 10/2010 | Stribley | H01L 21/266 257/335 |
| 2013/0044838 A1* | 2/2013 | Ding | H03B 5/1228 375/340 |
| 2013/0062529 A1* | 3/2013 | Hall | G01T 1/24 250/370.14 |
| 2015/0084128 A1 | 3/2015 | Gambino et al. | |
| 2015/0162323 A1* | 6/2015 | Taya | H01L 27/0629 257/296 |
| 2015/0194538 A1 | 7/2015 | Marino et al. | |

* cited by examiner

TRANSCAP MANUFACTURING TECHNIQUES WITHOUT A SILICIDE-BLOCKING MASK

CLAIM OF PRIORITY UNDER 35 U.S.C. § 119

This application is a divisional of U.S. patent application Ser. No. 15/429,252, filed Feb. 10, 2017, which is assigned to the assignee hereof and hereby expressly incorporated by reference herein in its entirety.

TECHNICAL FIELD

Certain aspects of the present disclosure generally relate to electronic circuits and, more particularly, to a variable semiconductor capacitor.

BACKGROUND

Semiconductor capacitors are fundamental components for integrated circuits. A variable capacitor is a capacitor whose capacitance may be intentionally and repeatedly changed under the influence of a bias voltage. A variable capacitor, which may be referred to as a varactor, is often used in inductor-capacitor (LC) circuits to set the resonance frequency of an oscillator, or as a variable reactance, e.g., for impedance matching in antenna tuners.

A voltage-controlled oscillator (VCO) is an example circuit that may use a varactor in which the thickness of a depletion region formed in a p-n junction diode is varied by changing a bias voltage to alter the junction capacitance. Any junction diode exhibits this effect (including p-n junctions in transistors), but devices used as variable capacitance diodes are designed with a large junction area and a doping profile specifically chosen to improve the device performance, such as quality factor and tuning range.

SUMMARY

Certain aspects of the present disclosure provide a semiconductor variable capacitor. The semiconductor variable capacitor generally includes a first non-insulative region disposed above a semiconductor region; a second non-insulative region, wherein the second non-insulative region is disposed adjacent to the semiconductor region; a first silicide layer disposed above the second non-insulative region, wherein the first silicide layer overlaps at least a portion of the semiconductor region; and a control region disposed adjacent to the semiconductor region such that a capacitance between the first non-insulative region and the second non-insulative region is configured to be adjusted by varying a control voltage applied to the control region.

Certain aspects of the present disclosure provide a semiconductor variable capacitor. The semiconductor variable capacitor generally includes a first non-insulative region disposed above a semiconductor region; a second non-insulative region disposed above the semiconductor region; a third non-insulative region disposed adjacent to the semiconductor region such that a capacitance between the first non-insulative region and the second non-insulative region is configured to be adjusted by varying a control voltage applied to the third non-insulative region; and a silicide layer disposed adjacent to the third non-insulative region, wherein the silicide layer is disposed above the semiconductor region and between a first portion and a second portion of the semiconductor region, wherein the first portion of the semiconductor region is disposed below the first non-insulative region, and wherein the second portion of the semiconductor region is disposed below the second non-insulative region.

Certain aspects of the present disclosure provide a method for fabricating a semiconductor variable capacitor. The method generally includes forming a first non-insulative region above a semiconductor region; forming a second non-insulative region adjacent to the semiconductor region; forming a first silicide layer above the second non-insulative region, wherein the first silicide layer overlaps at least a portion of the semiconductor region; and forming a control region adjacent to the semiconductor region such that a capacitance between the first non-insulative region and the second non-insulative region is configured to be adjusted by varying a control voltage applied to the control region.

Certain aspects of the present disclosure provide a method for fabricating a semiconductor variable capacitor. The method generally includes forming a first non-insulative region above a semiconductor region, forming a second non-insulative region above the semiconductor region, forming a third non-insulative region adjacent to the semiconductor region such that a capacitance between the first non-insulative region and the second non-insulative region is configured to be adjusted by varying a control voltage applied to the third non-insulative region, and forming a silicide layer adjacent to the third non-insulative region, wherein the silicide layer is formed above the semiconductor region and between a first portion and a second portion of the semiconductor region, wherein the first portion of the semiconductor region is formed below the first non-insulative region, and wherein the second portion of the semiconductor region is formed below the second non-insulative region.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Aspects of the present disclosure are generally directed to a semiconductor variable capacitor structure, also referred to as a "transcap," suitable for integrated circuits. A transcap device may have at least three terminals, where the capacitance between two main terminals of the device (C1 and C2) can be varied by changing a bias voltage applied between a control terminal CTRL and one of the other two main terminals (e.g., C2). Certain aspects of the present disclosure are generally directed to a transcap device that can be manufactured without the use of a silicide-blocking mask.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Figure 1:
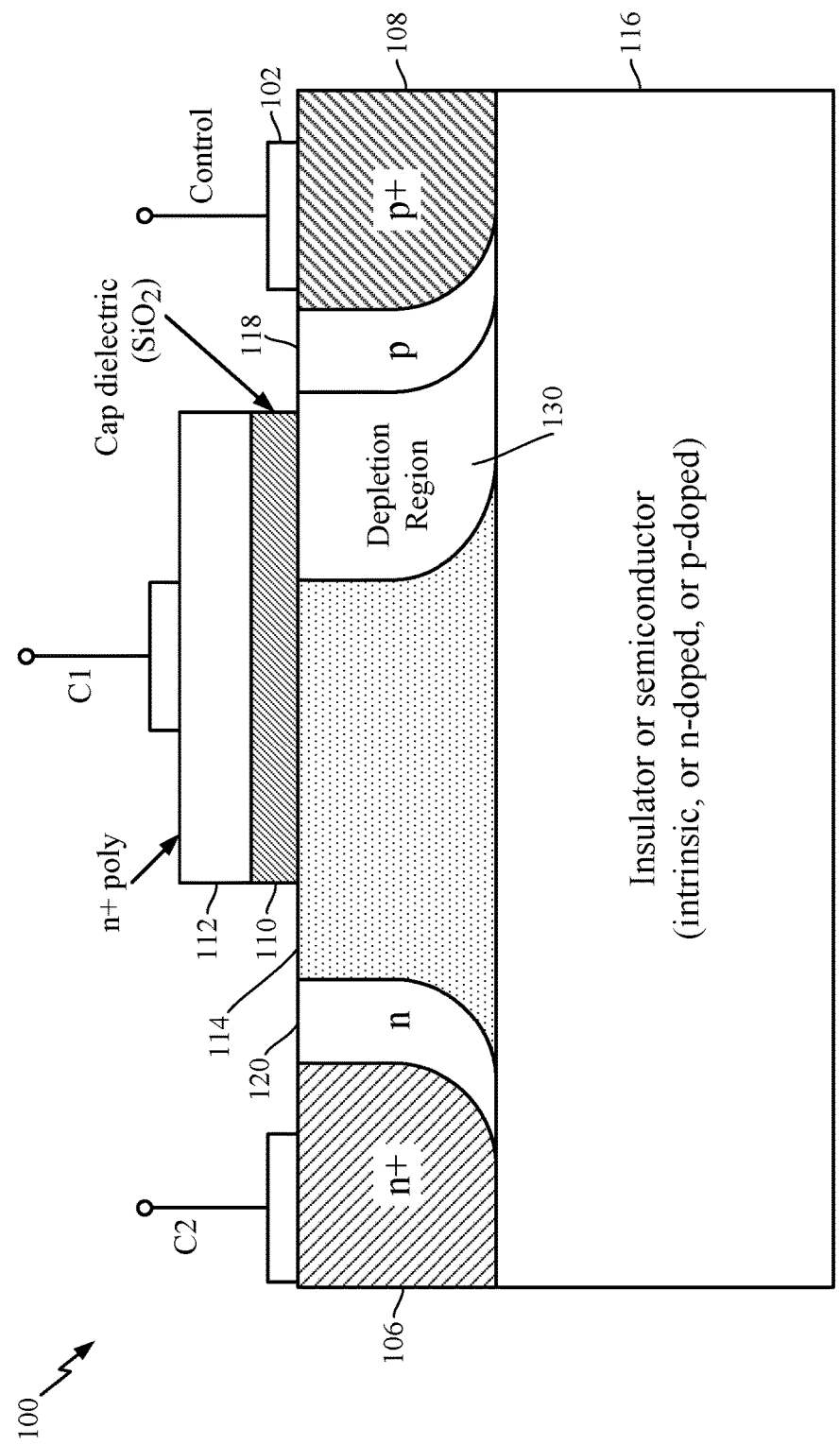
FIG. 1 is a cross-sectional view of an example semiconductor variable capacitor.

FIG. 1 illustrates an example structure of a transcap device 100. Certain implementations of a transcap device use an oxide layer 110, which may be used to fabricate metal-oxide semiconductor (MOS) devices (e.g., thin or thick gate oxide). The oxide layer 110 may isolate the C1 and C2 terminals, and thus, in effect act as a dielectric for the transcap device 100. A non-insulative region 106 (e.g., n+ implantation region) and a non-insulative region 108 (e.g., p+ implantation region) may be formed on the two sides of the transcap device 100 in order to create p-n junctions. As used herein, a non-insulative region generally refers to a region that may be conductive or semiconductive. A bias voltage may be applied between the control terminal 102 and the C2 terminal in order to modulate the capacitance between terminals C1 and C2. For example, by applying a bias voltage to the control terminal 102, a depletion region 130 may be formed between the p-n junction of non-insulative region 108 (e.g., control region) and the semiconductor region 114. Based on the bias voltage, this depletion region 130 may widen under the oxide layer 110, reducing the area of the equivalent electrode formed by the semiconductor region 114, and with it, the effective capacitance area and capacitance value of the transcap device 100.

The work-function of a non-insulative region 112 above the oxide layer 110 may be chosen to improve the device performance. For example, an n-doped poly-silicon material may be used (instead of p-doped), even if the semiconductor region 114 underneath the oxide layer 110 is doped with n-type impurities. In some aspects, a metallic material (also doped if desired) may be used for the non-insulative region 112 with an opportune work-function or a multi-layer stack of different metallic materials so as to obtain the desired work-function. The certain aspects, non-insulative region 112 may be divided into two sub-regions, one n-doped and one p-doped, or a different metallic material may be used for each sub-region.

In some cases, the semiconductor region 114 may be disposed above an insulator or semiconductor region 116. The type of material for the semiconductor region 116 may be chosen in order to improve the transcap device 100 performance. For example, the region 116 may be an insulator, a semi-insulator, or an intrinsic/near-intrinsic semiconductor in order to decrease the parasitic capacitances associated with the substrate (not shown). In some cases, the region 116 can be made of n-doped or p-doped semiconductor with an appropriate doping profile in order to increase the transcap device quality factor and/or the control on the depletion region 130 that may be formed between the non-insulative region 108 and the semiconductor region 114 when applying a bias voltage to the control terminal 102. The region 116 can be formed by multiple semiconductor layers or regions doped in different ways (n, p, or intrinsic). Furthermore, the region 116 can include semiconductors, insulating layers, and/or substrates or can be formed above semiconductors, insulating layers, and/or substrates.

To better understand the working principle of the transcap device 100, it may be assumed that the control terminal 102 is biased with a negative voltage with respect to the C2 terminal. The width of the depletion region 130 in the semiconductor region 114 may be controlled by applying a control voltage to the control terminal 102. The capacitance between the C1 and C2 terminals may depend on the width of the depletion region 130 in the semiconductor region 114, and thus, can be controlled by applying the control voltage to the control terminal 102. Furthermore, the variation of the bias voltage applied to the control terminal 102 may not alter the DC voltage between the C1 and C2 terminals, allowing for improved control of the device characteristics. Alternatively, the bias voltage can be applied to the C2 terminal with respect to other terminals of the device.

In some cases, it may be preferable to have the non-insulative region 106 and/or non-insulative region 108 a distance away from the oxide layer 110 in order to reduce the parasitic capacitance associated with the non-insulative region 108 and improve the isolation of the non-insulative region 106 for high control voltages. For example, the non-insulative region 106 can be partially overlapped by the oxide layer 110, or the non-insulative region 106 can be formed at a distance from the edge of the oxide layer 110 so as to increase the device tuning range and linearity. In the latter case, the voltage-withstanding capability of the device is improved since a portion of a radio-frequency (RF) signal, that may be applied to the C1 and C2 terminals, drops between the oxide edge and the non-insulative region 106 instead of being applied entirely across the oxide layer 110. The non-insulative region 108 can be partially overlapped by the oxide layer 110, or the non-insulative region 108 can be spaced apart so as to reduce the parasitic capacitance between the C1 terminal and the control terminal 102.

A p-doped region 118 can be optionally used to improve the breakdown voltage of the p-n junction between the non-insulative region 108 and the semiconductor region 114, decreasing, at the same time, the parasitic capacitance between the C1 terminal and the control terminal 102. Similarly, an optional n-doped region 120 can be added between the non-insulative region 106 and the semiconductor region 114 in order to regulate the doping concentration between the oxide layer 110 and the non-insulative region 106.

In some cases, a misalignment may be created between the non-insulative region 112 and the non-insulative region 106 in order to increase the tuning range of the transcap device 100. However, it may be difficult to increase the tuning range, while at the same time, maintaining a high quality factor for the transcap device. Certain aspects of the present disclosure are generally directed to creating this misalignment to increase the tuning range, while also decreasing the parasitic resistance associated with the current path between the C1 and C2 terminals to increase the quality factor of the transcap device 100.

In some cases, an n+-blocking mask and a silicide-blocking mask may be used to create the misalignment between the non-insulative region 112 and the non-insulative region 106. However, a silicide-blocking mask usually follows a series of design rule check(s) (DRC) rules, such as minimum mask width and minimum mask spacing, minimum clearance to contact, minimum clearance from mask to poly on active and minimum mask area, which may be more stringent than the DRC rules concerning the non-insulative region 106 (n+ implantation). As a consequence, the contact placement, and in particular, the misalignment design lead to a decrease of the device performance. For example, the distance between the non-insulative region 106 and the non-insulative region 112 may be increased in order to satisfy the above-mentioned DRC rules, which may cause a decrease in the quality factor of the transcap device 100, without leading to any increase in the tuning range of the capacitor. Furthermore, the silicide-blocking mask may prevent the silicide formation on at least a portion of the polysilicon layer such as the non-insulative region 106 and the non-insulative region 112, increasing the polysilicon resistance and therefore lowering the overall quality factor of the transcap device 100. Additionally, the distance from the silicide-blocking mask to the contacts may hinder the contacts placement directly on top of the polysilicon in the active region, which further decreases the quality factor of the transcap device 100. Certain of the present disclosure are generally directed to creating the misalignment between the non-insulative region 112 and the non-insulative region 106 without the use of a silicide-blocking mask.

Figure 2:
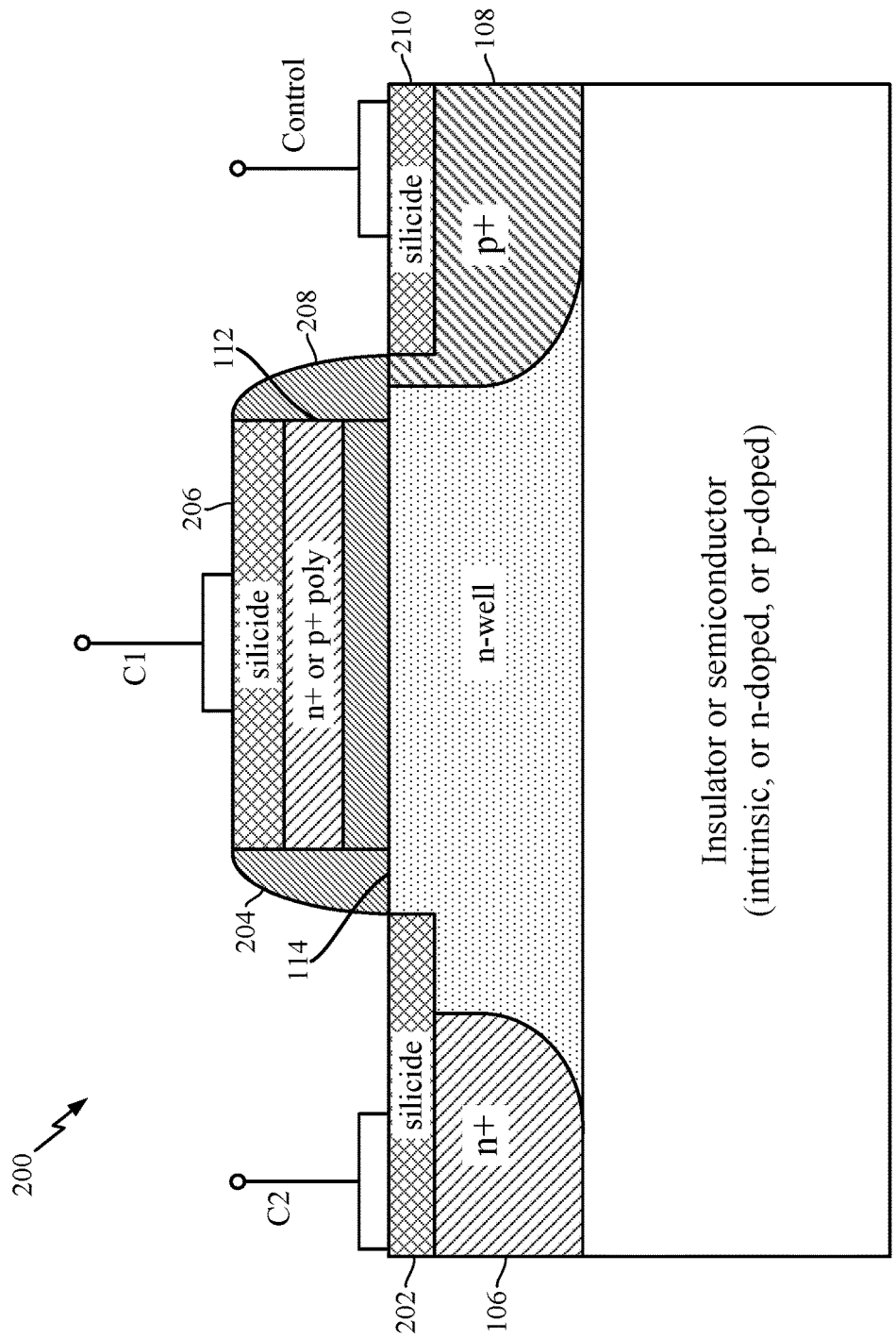
FIG. 2 is a cross-sectional view of an example semiconductor variable capacitor device having a silicide layer, in accordance with certain aspects of the present disclosure.

FIG. 2 illustrates an example transcap device 200 having a silicide layer 202, in accordance with certain aspects of the present disclosure. The non-insulative region 112 may be coupled to an insulative spacer 204. As illustrated, the silicide layer 202 may be formed above the non-insulative region 106 and overlap at least a portion of the semiconductor region 114. For example, the silicide layer 202 may extend to an edge of the insulative spacer 204. In certain aspects, a silicide layer 206 may be formed above the non-insulative region 112 and the silicide layer 206 may extend the entire length of the non-insulative region 112, as illustrated. That is, the silicide layer 206 may extend from the insulative spacer 204 to an insulative spacer 208. In certain aspects, the transcap device 200 also includes a silicide layer 210 disposed above the control region 108. As illustrated, the entire length of the silicide layer 210 is disposed above the control region 108. For example, the silicide layer 210 may extend to an edge of the insulative spacer 208, and the control region 108 may extend past the silicide layer 210 such that the silicide layer 210 does not short the p-n junction between the control region 108 and the semiconductor region 114.

In certain aspects during fabrication, silicide is formed across the entire length of the transcap device 200 with the exception of the insulative spacers 204 and 208, which block the formation of the silicide layer(s). Thus, a silicide-blocking mask may not be used in the formation of the silicide layers 202, 206, and 210. The implementation of FIG. 2 improves the quality factor of the transcap device 200 by decreasing the fringing capacitance between the non-insulative region 106 and the non-insulative region 112 through the depleted n-well, and at the same time, improving the quality factor of the transcap device 200. As illustrated, the silicide layers 202, 206, and 210 do not diffuse laterally underneath the insulative spacers 204 and 208, allowing for a misalignment equal to a width of the insulative spacers 204 and 208, while at the same time, reducing the parasitic resistance between the non-insulative region 106 and the non-insulative region 112.

Figure 3:
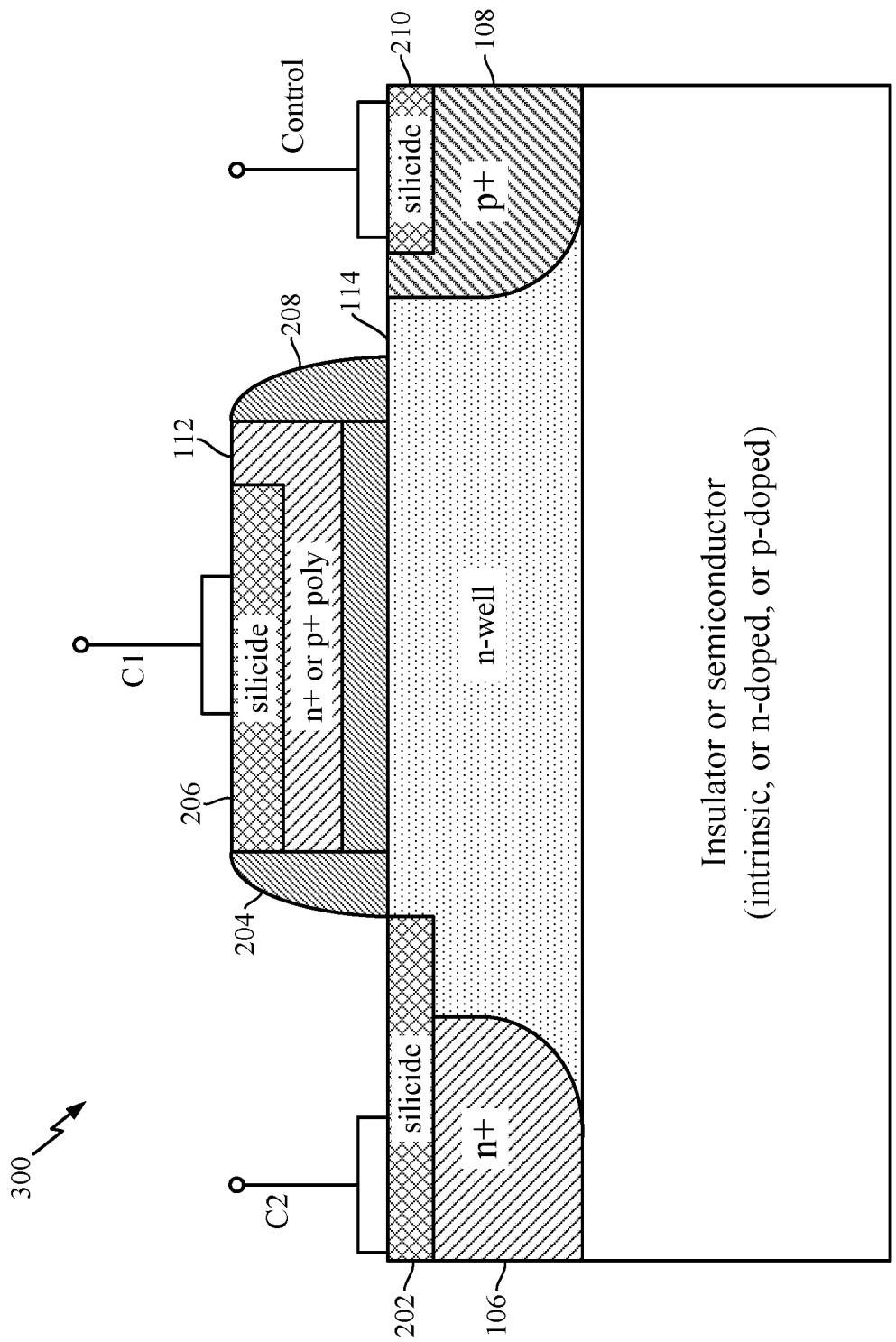
FIG. 3 is a cross-sectional view of an example semiconductor variable capacitor device with misalignment between the control region and a non-insulative region, in accordance with certain aspects of the present disclosure.

FIG. 3 illustrates an example transcap device 300 with misalignment between the control region 108 and the non-insulative region 112, in accordance with certain aspects of the present disclosure. In this case, a silicide-blocking mask may be used between the control region 108 and the non-insulative region 112 during fabrication of the transcap device 300. Thus, in contrast with FIG. 2, the silicide layer 210 does not extend to the edge of the insulative spacer 208. Moreover, in certain aspects and as illustrated in FIG. 3, the silicide-blocking mask may also be used over a portion of the non-insulative region 112 during fabrication such that the silicide layer 206 extends across only a portion of the non-insulative region 112.

Figure 4:
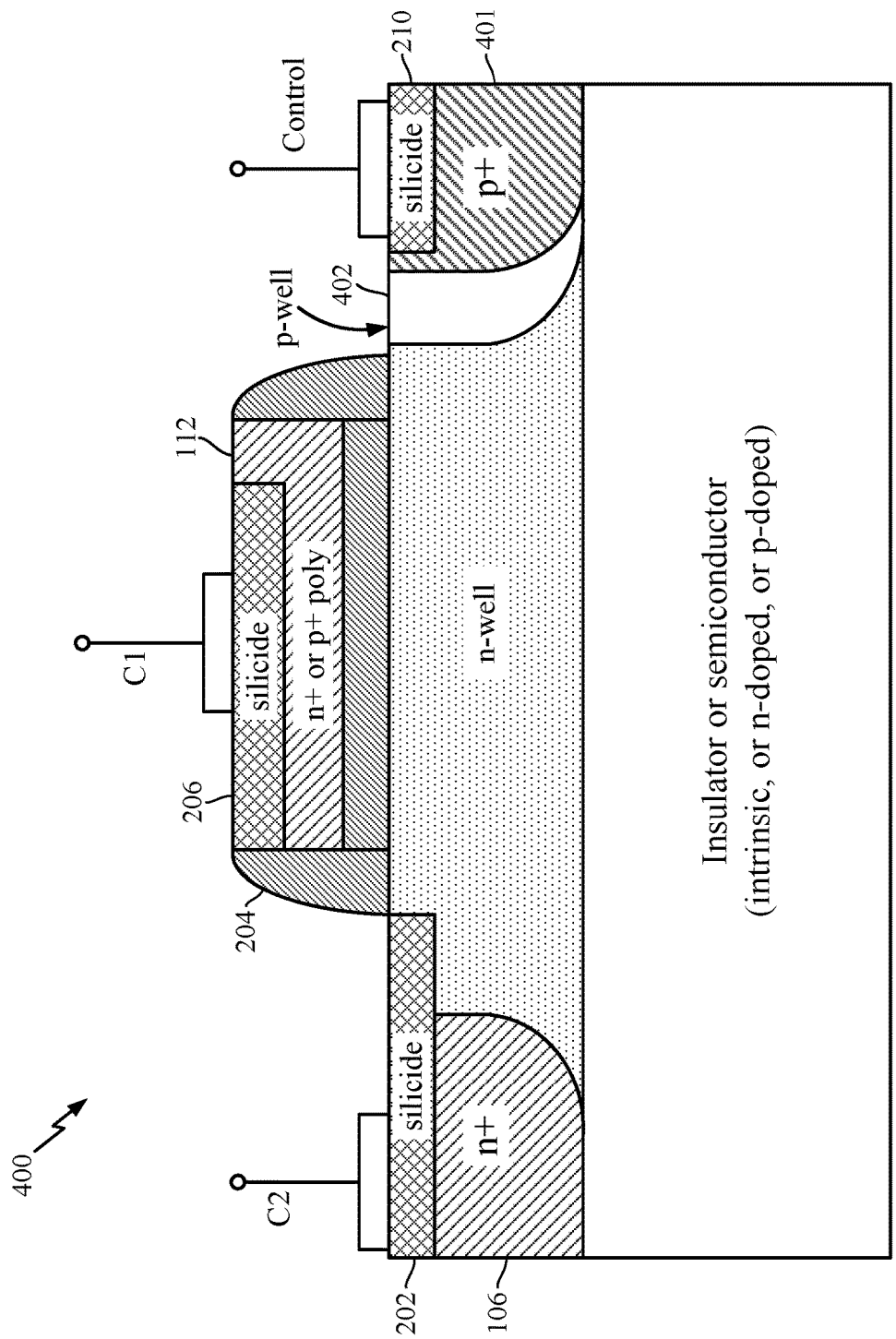
FIG. 4 is a cross-sectional view of an example semiconductor variable capacitor device with the control region implemented with a p+ region formed in a p– well region, in accordance with certain aspects of the present disclosure.

FIG. 4 illustrates an example transcap device 400 with the control region implemented with a control region (e.g., p+ region) 401 formed in a p-well region 402, in accordance with certain aspects of the present disclosure. The pn junction between the p-well region 402 and semiconductor region 114 can be formed as shown in FIG. 4 (not overlapping with the poly-oxide) or under the poly-oxide (e.g., non-insulative region 112). Furthermore, the p+ implantation (e.g., control region 401) can be self-aligned with the non-insulative region 112 or misaligned (as shown in FIG. 4). When the control region 401 is not self-aligned with the non-insulative region 112, it may be difficult to guarantee that the p-n junction is not exposed to silicide on the surface of the semiconductor region 114. In this case, a silicide-blocking mask may be used between the control region 401 and the non-insulative region 112 as shown in FIG. 4 to manufacture the transcap device.

Figure 5:
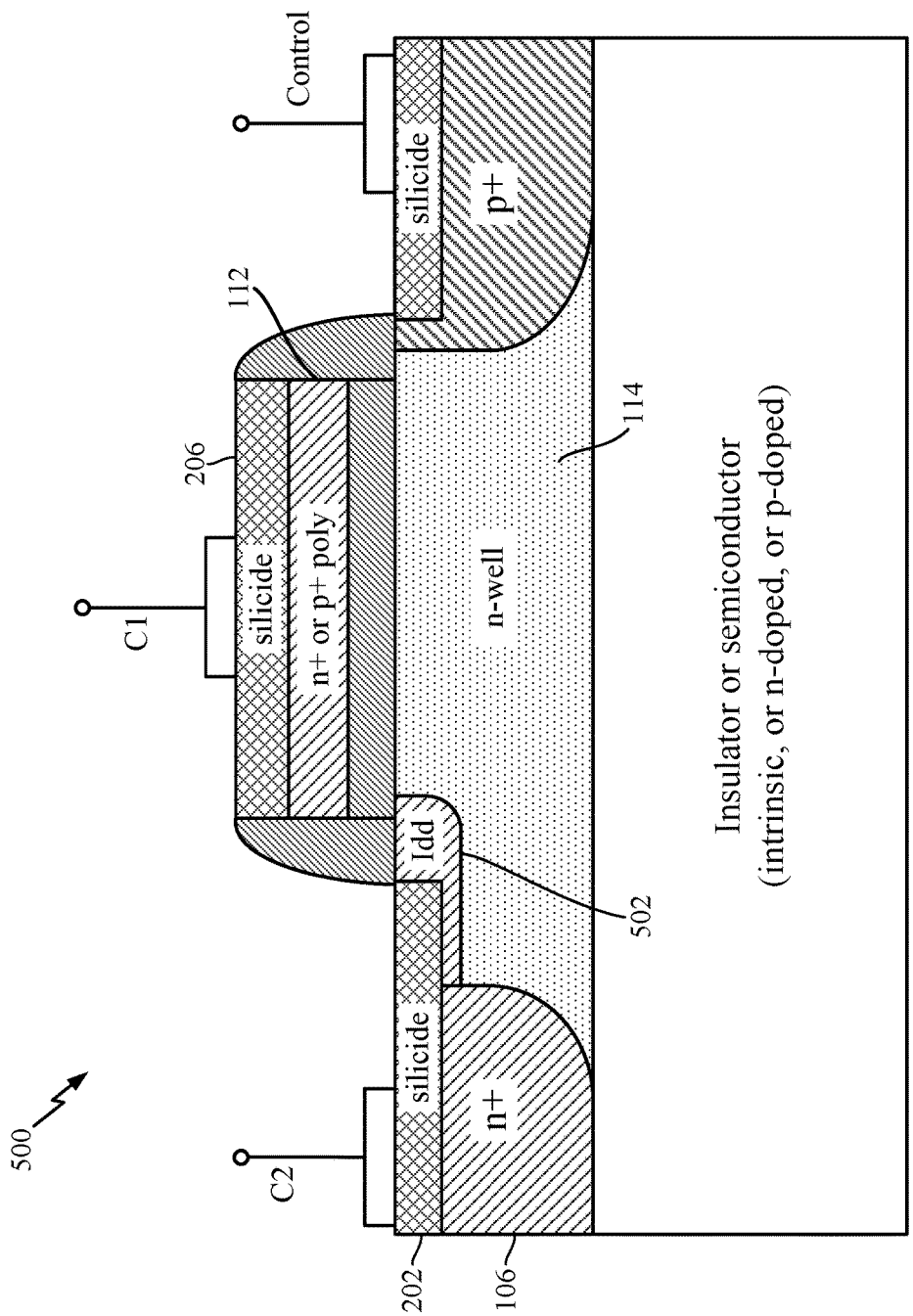
FIG. 5 is a cross-sectional view of an example semiconductor variable capacitor device implemented with a low-doped implantation region, in accordance with certain aspects of the present disclosure.

FIG. 5 illustrates an example transcap device 500 implemented with a low-doped implantation region 502, in accordance with certain aspects of the present disclosure. The low-doped implantation region 502 may also be referred to as a lightly doped drain (LDD) region or a superficial implantation. As illustrated, the low-doped implantation region 502 is disposed adjacent to the non-insulative region 106 and may be formed to extend to an edge (or close to the edge) of the non-insulative region 112. The low-doped implantation region 502 decreases the resistance of the transcap device 500, improving quality factor.

Figure 6:
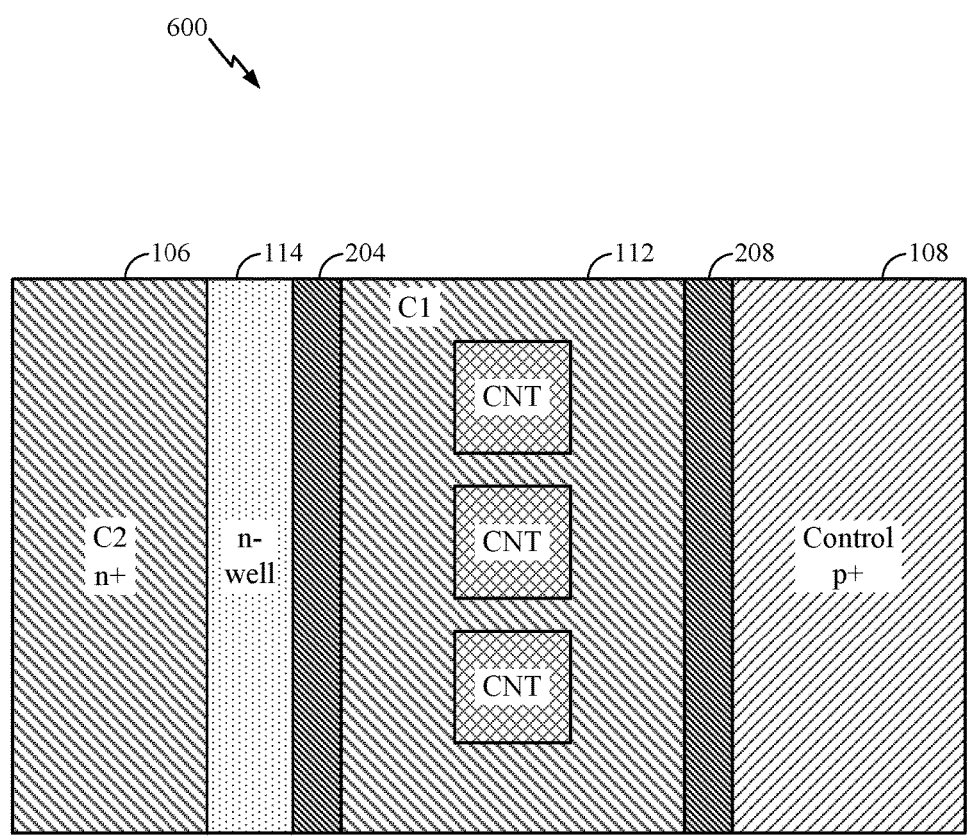
FIG. 6 is a top-down view of an example semiconductor variable capacitor device with conductive pads coupled to the non-insulative region, in accordance with certain aspects of the present disclosure.

FIG. 6 illustrates an example top view of the transcap device 600 with conductive pads coupled to the non-insulative region 112, in accordance with certain aspects of the present disclosure. In the illustration of FIG. 6, the silicide has been omitted to show the underlying structure of the transcap device 600. As presented above, certain aspects of the present disclosure avoid using a silicide-blocking layer. By not using a silicide-blocking layer, flexibility in placing conductive pads (e.g., contacts (CNT)) on the non-insulative region 112 (e.g., active poly region) is increased. With a silicide-blocking layer, placing conductive pads on the non-insulative region 112 may be difficult without using a large "gate" length at the cost of reduced quality factor. As illustrated, the conductive pads have been placed directly on the non-insulative region 112 (i.e., on the polysilicon inside the active region of the transcap device 600) to improve the quality factor of the transcap device 600. This conductive pad placement reduces the parasitics of the transcap device 600 as compared to aspects where conductive pad formation is restricted to polysilicon regions outside the active area of the transcap device. Using silicide on top of the non-insulative region 112 hinders the contact metal of the conductive pads from diffusing through the polysilicon of the non-insulative region 112 and perforating the thermal oxide.

Using conductive pads on the active poly also allows for a reduction in the silicon area used to manufacture the transcap device, since longer interdigitated fingers can be used to implement the device layout. In addition, by avoiding the use of a silicide-blocking mask between the non-insulative regions 106 and 108 and at the same time placing multiple contacts on top of the polysilicon layer in the active regions, high quality factor (e.g., in excess of 100 at 2 GHz) can be achieved in standard CMOS process technologies.

Figure 7:
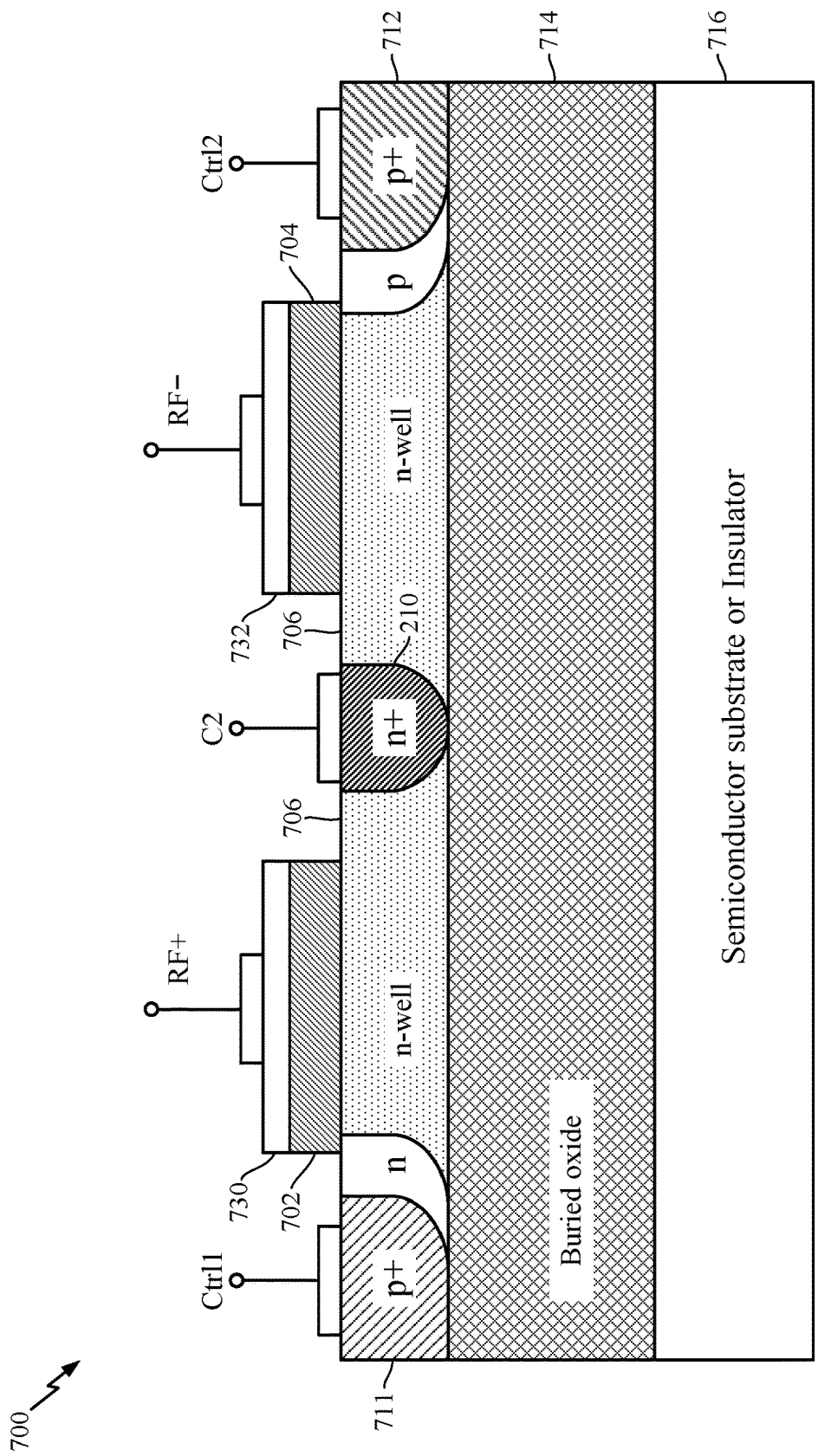
FIG. 7 is a cross-sectional view of an example differential semiconductor variable capacitor device, in accordance with certain aspects of the present disclosure.

FIG. 7 illustrates an example differential transcap device 700, in accordance with certain aspects of the present disclosure. The differential transcap device 700 can be obtained by disposing two of the transcap devices 100 back-to-back. In this example, RF+ and RF− terminals (e.g., corresponding to the C1 terminal in FIG. 1) correspond to the positive and negative nodes of a differential RF port for a differential RF signal. The RF+ terminal may be coupled to a non-insulative region 730 disposed above an insulative layer 702, and the RF− terminal may be coupled to a non-insulative region 732 disposed above an insulative layer 704. Semiconductor region 706 may be coupled to a C2 terminal via a non-insulative region 710 (e.g., n+), as illustrated. A bias voltage may be applied to the control regions 711 and 712 (and/or to the C2 terminal with respect to other terminals of the device) to adjust a depletion region of the semiconductor region 706, respectively, thereby adjusting the capacitance between respective RF+ and RF− terminals and the C2 terminal. In some aspects, a buried oxide layer 714 may be positioned below the semiconductor region 706 and above a semiconductor substrate or insulator 716, as illustrated.

Figure 8:
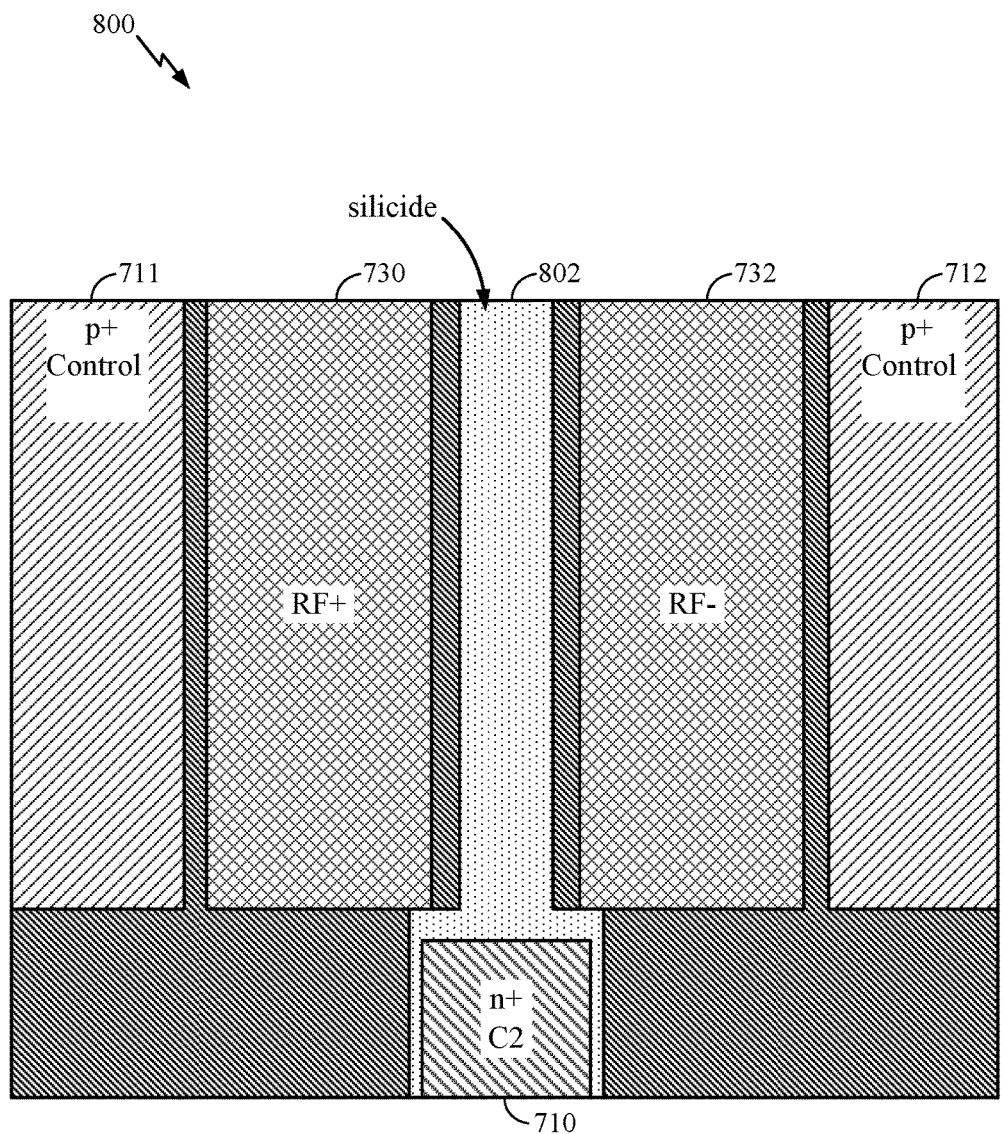
FIG. 8 is a top-down view of an example differential semiconductor variable capacitor device having a silicide layer, in accordance with certain aspects of the present disclosure.

FIG. 8 illustrates a top-down view of an example differential transcap device 800, in accordance with certain aspects of the present disclosure. A silicide layer 802 may be coupled to the non-insulative region 710 and extend between portions of the semiconductor region 706 over which the non-insulative regions 730 and 732 are disposed. The silicide layer 802 can be used to propagate a bias voltage applied to the non-insulative region 710 over the semiconductor region 706 (not shown in FIG. 8) and between portions of the semiconductor region 706 over which the non-insulative regions 730 and 732 are formed.

Figure 9:
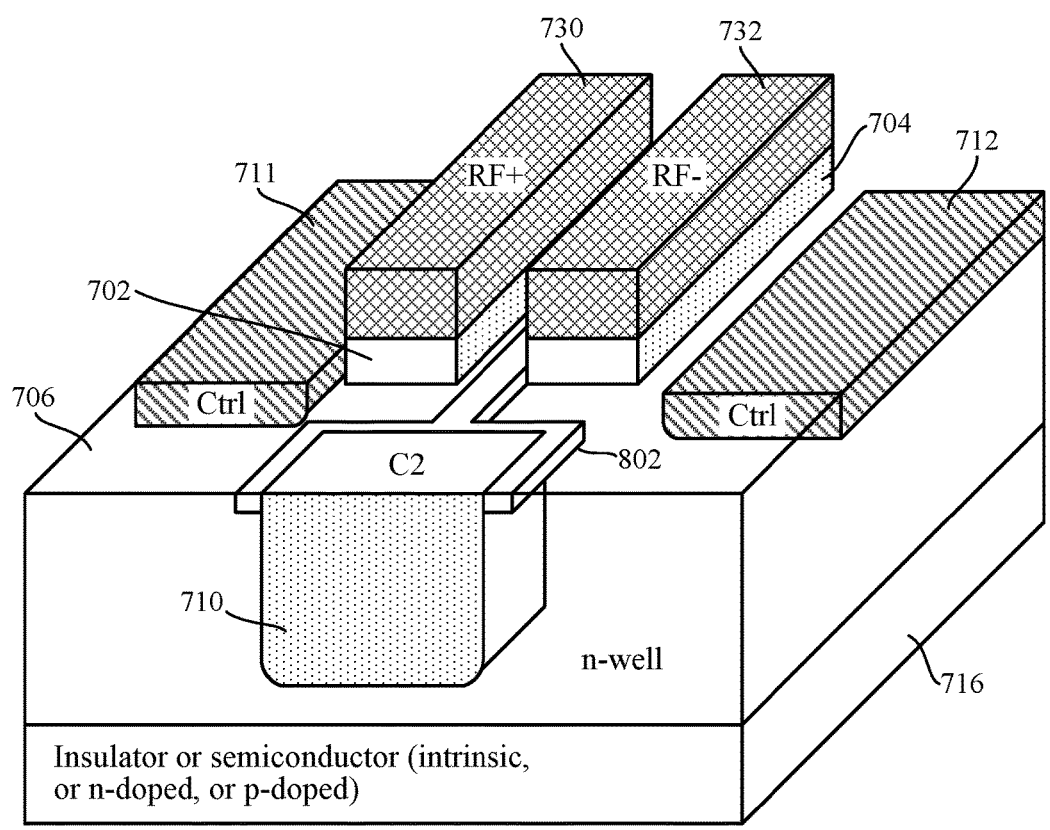
FIG. 9 is a three-dimensional view of the example semiconductor variable capacitor device of FIG. 8, in accordance with certain aspects of the present disclosure.

FIG. 9 is a three-dimensional view of the example transcap device 800, in accordance with certain aspects of the present disclosure. As illustrated, the silicide layer 802 is disposed over the non-insulative region 710 and extends between portions of the semiconductor region 706 over which the non-insulative regions 730 and 732 are disposed.

A p-type version for any of the transcap devices of FIGS. 1-9 can be obtained by replacing the n-doped regions with p-doped regions and vice versa. Moreover, in certain aspects, multiple transcap devices as described herein may be stacked on top of each other.

Figure 10:
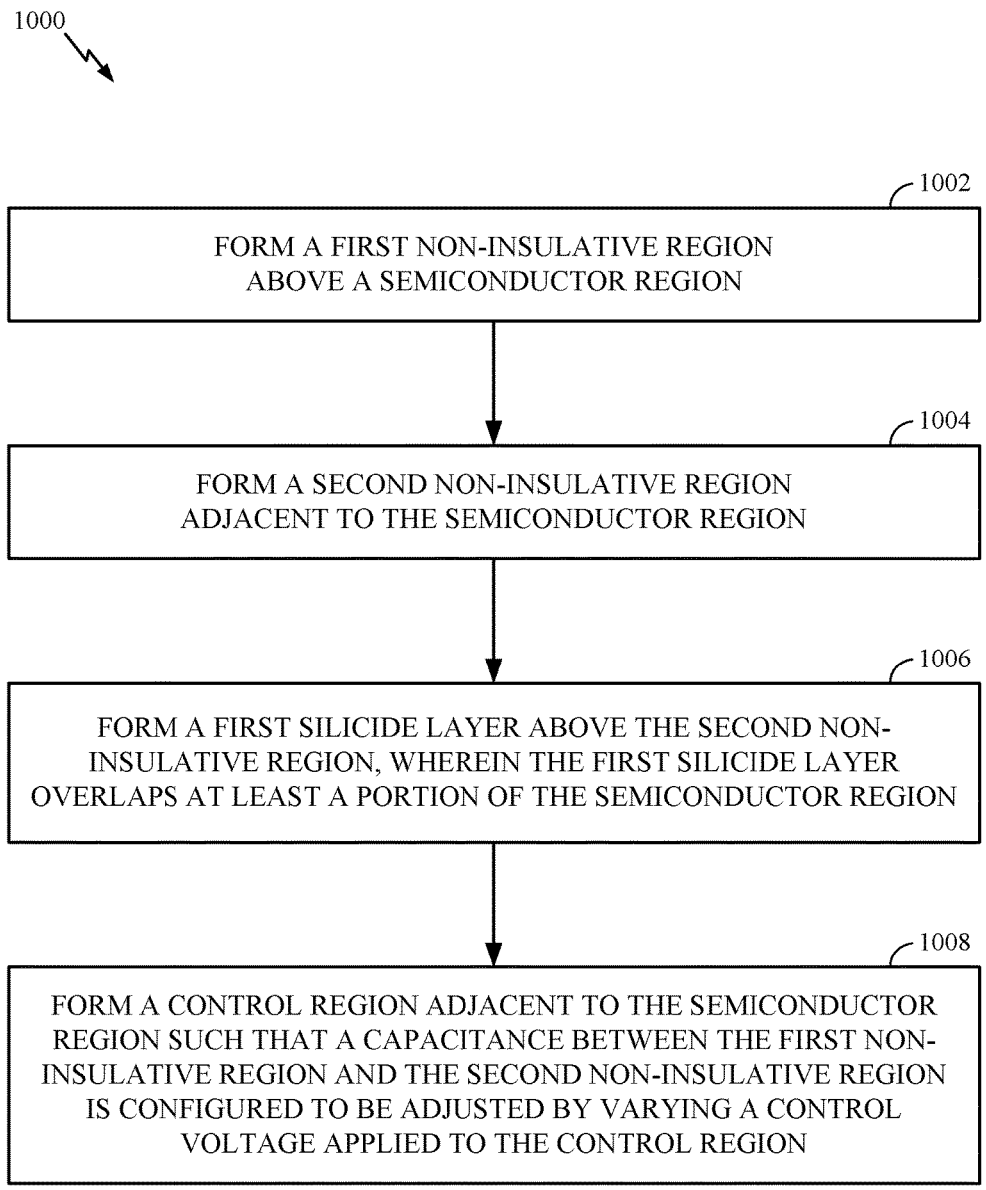
FIG. 10 is a flow diagram of example operations for fabricating a semiconductor variable capacitor, in accordance with certain aspects of the present disclosure.

FIG. 10 is a flow diagram of example operations 1000 for fabricating a semiconductor variable capacitor, in accordance with certain aspects of the present disclosure. The operations 1000 may be performed, for example, by a semiconductor processing chamber.

Operations 1000 may begin at block 1002 by forming a first non-insulative region (e.g., non-insulative region 112) above a semiconductor region (e.g., semiconductor region 114), and at block 1004, by forming a second non-insulative region (e.g., non-insulative region 106) adjacent to the semiconductor region. At block 1006, a first silicide layer (e.g., silicide layer 202) is formed above the second non-insulative region, wherein the first silicide layer overlaps at least a portion of the semiconductor region. At block 1008, the operations 1000 continue by forming a control region (e.g., control region 108) adjacent to the semiconductor region such that a capacitance between the first non-insulative region and the second non-insulative region is configured to be adjusted by varying a control voltage applied to the control region.

In certain aspects, the operations 1000 also include forming an insulative spacer (e.g., insulative spacer 204) adjacent to side surfaces (e.g., lateral surfaces) of the first non-insulative region and above the semiconductor region. In this case, the first silicide layer may extend to an edge of the insulative spacer.

In certain aspects, the operations 1000 include forming a layer of insulative material (e.g., oxide layer 110) between the first non-insulative region and the semiconductor region. In certain aspects, a second silicide layer (e.g., silicide layer 206) is formed above the first non-insulative region. In certain aspects, the second silicide layer extends across the entire length of the first non-insulative region. In certain aspects, one or more conductive pads are formed above the second silicide layer.

In certain aspects, a second silicide layer (e.g., silicide layer 210) is formed above at least a portion of the control region. In certain aspects, an insulative spacer (e.g., insulative layer 208) is formed adjacent to side surfaces (e.g., lateral surfaces) of the first non-insulative region and above the semiconductor region, wherein the second silicide layer extends to an edge of the insulative spacer. In certain aspects, an entire length of the second silicide layer is formed above the control region.

In certain aspects, a low-doped implantation region (e.g., low-doped implantation region 502) is formed above at least a portion of the semiconductor region and adjacent to the first silicide layer. In certain aspects, the control voltage is applied to the control region with respect to the second non-insulative region.

Figure 11:
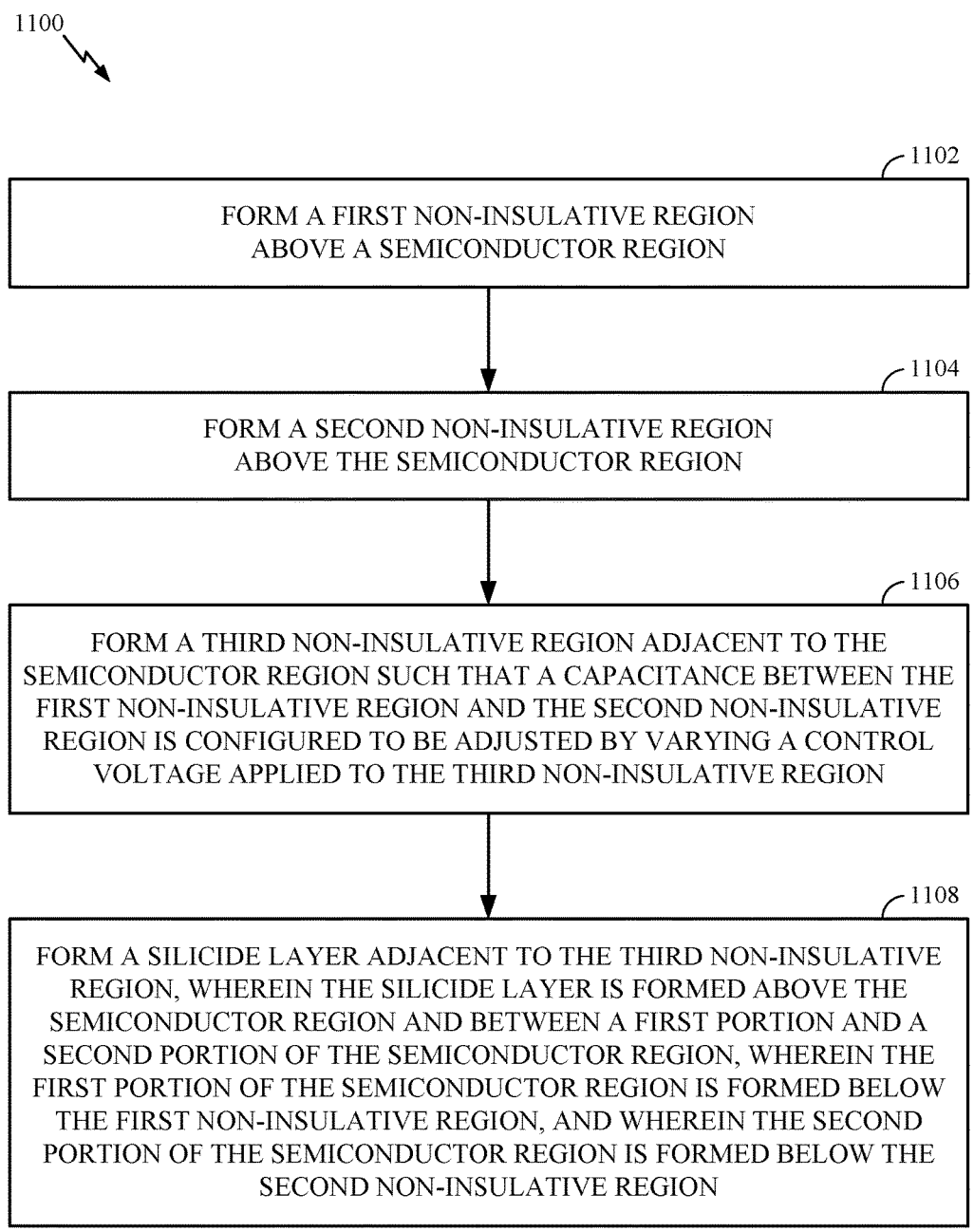
FIG. 11 is a flow diagram of example operations for fabricating a differential semiconductor variable capacitor, in accordance with certain aspects of the present disclosure.

FIG. 11 is a flow diagram of example operations 1100 for fabricating a differential semiconductor variable capacitor, in accordance with certain aspects of the present disclosure. The operations 1100 may be performed, for example, by a semiconductor processing chamber.

Operations 1100 may begin at block 1102 by forming a first non-insulative region (e.g., non-insulative region 730) above a semiconductor region (e.g., semiconductor region 706), and at block 1104, by forming a second non-insulative region (e.g., non-insulative region 732) above the semiconductor region. At block 1106, a third non-insulative region (e.g., non-insulative region 710) is formed adjacent to the semiconductor region such that a capacitance between the first non-insulative region and the second non-insulative region is configured to be adjusted by varying a control voltage applied to the third non-insulative region. At block 1108, the operations 1100 continue by forming a silicide layer (e.g., silicide layer 802) adjacent to the third non-insulative region. In certain aspects, the silicide layer is formed above the semiconductor region and between a first portion and a second portion of the semiconductor region. The first portion of the semiconductor region may be formed below the first non-insulative region, and the second portion of the semiconductor region may be formed below the second non-insulative region.

In certain aspects, the operations 1100 continue by forming a first control region (e.g., control region 711), and forming a second control region (e.g., control region 712). The first control region and the second control region may be formed adjacent to the semiconductor region such that another control voltage applied to at least one of the first control region or the second control region is configured to vary the capacitance between the first non-insulative region and the second non-insulative region. In certain aspects, the first portion of the semiconductor region and the second portion of the semiconductor region are formed between the first control region and the second control region.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:
1. A semiconductor variable capacitor comprising:
  a first non-insulative region disposed above a semiconductor region;
  a second non-insulative region disposed above the semiconductor region;
  a third non-insulative region disposed adjacent to the semiconductor region such that a capacitance between the first non-insulative region and the second non- insulative region is configured to be adjusted by varying a control voltage applied to the third non-insulative region; and a silicide layer disposed adjacent to the third non-insulative region, wherein the silicide layer is disposed above the semiconductor region and between a first portion and a second portion of the semiconductor region, wherein the first portion of the semiconductor region is disposed below the first non-insulative region, and wherein the second portion of the semiconductor region is disposed below the second non-insulative region.

2. The semiconductor variable capacitor of claim 1, further comprising:

a first control region; and a second control region, wherein the first control region and the second control region are disposed adjacent to the semiconductor region such that another control voltage applied to at least one of the first control region or the second control region is configured to vary the capacitance between the first non-insulative region and the second non-insulative region.

3. The semiconductor variable capacitor of claim 2, wherein the first portion of the semiconductor region and the second portion of the semiconductor region are disposed between the first control region and the second control region.

4. The semiconductor variable capacitor of claim 1, wherein each of the first non-insulative region and the second non-insulative region is isolated from the semiconductor region by a layer of insulative material.

5. The semiconductor variable capacitor of claim 1, further comprising a low-doped implantation region disposed above at least a portion of the semiconductor region and between the first portion and the second portion of the semiconductor region.

6. A method for fabricating a semiconductor variable capacitor comprising:

forming a first non-insulative region above a semiconductor region;

forming a second non-insulative region above the semiconductor region;

forming a third non-insulative region adjacent to the semiconductor region such that a capacitance between the first non-insulative region and the second non-insulative region is configured to be adjusted by varying a control voltage applied to the third non-insulative region; and forming a silicide layer adjacent to the third non-insulative region, wherein the silicide layer is formed above the semiconductor region and between a first portion and a second portion of the semiconductor region, wherein the first portion of the semiconductor region is formed below the first non-insulative region, and wherein the second portion of the semiconductor region is formed below the second non-insulative region.

7. The method of claim 6, further comprising:

forming a first control region; and forming a second control region, wherein the first control region and the second control region are formed adjacent to the semiconductor region such that another control voltage applied to at least one of the first control region or the second control region is configured to vary the capacitance between the first non-insulative region and the second non-insulative region.

8. The method of claim 7, wherein the first portion of the semiconductor region and the second portion of the semiconductor region are formed between the first control region and the second control region.

* * * * *